US010935685B2

(12) United States Patent
Kubo

(10) Patent No.: US 10,935,685 B2
(45) Date of Patent: Mar. 2, 2021

(54) CAPACITIVE PROXIMITY SENSOR AND HUMAN BODY DETECTION METHOD USING CAPACITIVE PROXIMITY SENSOR

(71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd.

( * ) Notice: Subject to any disclaimer, the term of this patent is extended or adjusted under 35 U.S.C. 154(b) by 269 days.

(21) Appl. No.: 16/174,468

(22) Filed: Oct. 30, 2018

(65) Prior Publication Data

US 2020/0025964 A1    Jan. 23, 2020

(30) Foreign Application Priority Data

Feb. 16, 2018  (JP) .............................. JP2018-025592

(51) Int. Cl.
| | | |
|---|---|---|
| *G01V 3/00* | (2006.01) | |
| *G01D 5/24* | (2006.01) | |
| *H03K 17/955* | (2006.01) | |
| *H03K 17/96* | (2006.01) | |
| *G01D 5/241* | (2006.01) | |

(52) U.S. Cl.
CPC .............. *G01V 3/00* (2013.01); *G01D 5/24* (2013.01); *H03K 17/955* (2013.01); *G01D 5/2417* (2013.01); *H03K 2017/9606* (2013.01)

(58) Field of Classification Search
CPC ..... H03K 2017/954; H03K 2017/9455; H03K 17/952–9547; H03K 2217/960755; H03K 2217/960705; G01D 5/24; G01D 5/2405; E05B 81/77–78; G07C 2209/64; G07C 2209/65; G01V 3/08; H01Q 1/3241; G01R 15/16–165; G01R 27/2605
USPC .................................. 324/675, 682; 340/562
See application file for complete search history.

(56) References Cited

U.S. PATENT DOCUMENTS

| | | | | |
|---|---|---|---|---|
| 2002/0030594 A1* | 3/2002 | Inaba | ................... | B60R 25/246 |
| | | | | 340/562 |
| 2007/0164723 A1* | 7/2007 | Yanagisawa | ........... | G01R 15/16 |
| | | | | 324/76.11 |

(Continued)

FOREIGN PATENT DOCUMENTS

| | | |
|---|---|---|
| JP | 2001055852 A | 2/2001 |
| JP | 2001141836 A  * | 5/2001 |

(Continued)

*Primary Examiner* — David L Singer
(74) *Attorney, Agent, or Firm* — Jordan and Koda, PLLC

(57) ABSTRACT

A capacitive proximity sensor 1 comprises an oscillation means 33; a sensor circuit 10, which includes a sensor electrode 11; a detection circuit 20, which outputs a determination voltage signal corresponding to the capacitance of the sensor electrode 11, based on the electrical signal output from the sensor circuit 10; and a control unit 32. The sensor electrode 11 is connected in parallel to a connection point P1 between a coil L and a capacitor C in an LCR series resonance circuit. The detection circuit 20 outputs a determination voltage signal $S_1$ based on the electrical signal at the detection point P3 between the capacitor C and the resistor R. The control unit 32 detects the proximity of a human body to the sensor electrode 11, based on the determination voltage signal $S_1$.

7 Claims, 9 Drawing Sheets

(56) References Cited

U.S. PATENT DOCUMENTS

| | | | | |
|---|---|---|---|---|
| 2010/0219840 A1* | 9/2010 | Motojima | ............ | H03K 17/962 |
| | | | | 324/633 |
| 2012/0112767 A1* | 5/2012 | Nonogaki | ............ | H03K 17/955 |
| | | | | 324/633 |
| 2014/0362310 A1* | 12/2014 | Nanbu | ................. | G06F 3/0416 |
| | | | | 349/12 |
| 2016/0371909 A1* | 12/2016 | Tabata | ................. | B60R 25/406 |
| 2017/0032596 A1* | 2/2017 | Tabata | ..................... | H01Q 7/00 |
| 2017/0351359 A1* | 12/2017 | Lo | ........................ | A63H 33/26 |

FOREIGN PATENT DOCUMENTS

| | | |
|---|---|---|
| JP | 2002039708 A | 2/2002 |
| JP | 2002057564 A | 2/2002 |

\* cited by examiner

CAPACITIVE PROXIMITY SENSOR AND HUMAN BODY DETECTION METHOD USING CAPACITIVE PROXIMITY SENSOR

BACKGROUND OF THE INVENTION

The present invention relates to a capacitive proximity sensor which is arranged, for example, in a door handle of a vehicle or the like, and which detects the proximity or touch of a person (hand or the like). The present invention fBrther relates to a human body detection method using this capacitive proximity sensor.

Recently, automobiles are equipped with keyless entry systems, which can lock and unlock doors without key operations. Keyless entry systems comprise: an authentication unit provided within the vehicle; a remote device carried by a user; a proximity sensor, provided on a door handle at the exterior of the vehicle, which detects contact when a user contacts a predetermined position on the door handle; a locking unit, which locks the door; and an unlocking unit, which unlocks the door.

Known proximity sensors include capacitive proximity sensors, which detect the proximity of an object based on changes in the capacitance of a sensor electrode. Furthermore, in capacitive proximity sensors, it is known to use a resonance circuit including a sensor electrode in order to ensure a large change in the output signal between proximity and non-proximity of an object and thus improve detection accuracy.

For example, Japanese Patent Laid-Open Publication No. 2002-39708 describes a capacitive proximity sensor in which a capacitance including the electrode capacitance of a sensor electrode is used as a resonance capacitance, this resonance capacitance and a resonance inductor are connected in series to form a series resonance circuit having a resonance frequency fr, the series resonance circuit is resonated at an excitation frequency higher than the resonance frequency fr, and objects are detected based on the resonance voltage of the series resonance circuit.

With the proximity sensor described in Japanese Patent Laid-Open Publication No. 2002-39708, by setting the excitation frequency higher than the resonance frequency fr, the resonance voltage will always decrease when an object is in the proximity of the sensor electrode, and therefore it is possible to detect the object from the change in the resonance voltage. 2002-57564

Japanese Patent Laid-Open Publication No. 2002-57564 describes a human body detector provided with a capacitive sensor including a sensor resonance circuit and a detection circuit. In this sensor resonance circuit, a sensor electrode is connected to a resonance circuit comprising a coil and a capacitor and, in a steady state where nothing contacts the sensor electrode, a constant frequency voltage is output but, if an object contacts the sensor electrode such that the capacitance is changed, a voltage is output in which the amplitude of the constant frequency voltage is changed in accordance with the change in the capacitance.

The human body detector described in Japanese Patent Laid-Open Publication No. 2002-57564 distinguishes between human bodies and raindrops, based on changes in the output frequency, or the output within a predetermined time, when the output of a capacitive sensor is received.

Japanese Patent Laid-Open Publication No. 2001-55852 describes a capacitive proximity sensor comprising an LC resonance circuit that is resonated by an oscillation means at a harmonic of an oscillation frequency, a detection electrode connected to the LC resonance circuit, and a detection means that detects changes in a signal, based on changes in the capacitance between the detection electrode and an object to be detected.

In the capacitive proximity sensor described in Japanese Patent Laid-Open Publication No. 2001-55852, because the resonance means resonates this at a harmonic, the value of current flowing through the circuit can be lowered, such that power consumption can be reduced, and battery life can be extended.

However, all of the sensors described in these publications are sensors in which the sensor electrode voltage is directly input to the detection circuit, and therefore, if the input impedance of the detection circuit is small, the very small current flowing through the sensor electrode will readily be affected. Therefore, in order to detect the very small stray capacitance (on the order of several pF) of the sensor electrode, it is necessary to make the input impedance of the detection circuit very high. When a detection circuit with high input impedance such as described above is used, there is a problem in that, if the input impedance changes due to environmental temperature change or the like, accurate detection becomes difficult. Furthermore, there is also a problem in that, a detection circuit having a high input impedance is generally likely to pick up noise, such that it is not possible to fBlly prevent erroneous operation due to the influence of external electromagnetic noise from radio equipment such as cell phones or the like.

SUMMARY OF THE INVENTION

One or more embodiments of the present invention provide a capacitive proximity sensor that is less susceptible to environmental temperature changes and noises and that can detect the proximity of a human body to a sensor electrode with higher accuracy and a human body detection method using this capacitive proximity sensor.

Note that, in the aspects described below, the constituent elements employed can be used in the most freely chosen combinations possible. Furthermore, the aspects and technical features of the present invention are not limited to those described hereafter, and are to be understood based on the description in the entire specification and the drawings, or based on the inventive ideas that can be grasped by the skilled artisan based on these descriptions.

In a first aspect of the present invention relating to a capacitive proximity sensor comprises:

an oscillation means, which outputs a high-frequency signal;

a sensor circuit to which a high-frequency signal is input, and which includes a sensor electrode;

a detection circuit, which outputs a determination voltage signal corresponding to the capacitance of the sensor electrode, based on an electrical signal output from the sensor circuit; and a control unit, wherein the sensor circuit has an LCR series resonance circuit, in which a coil L, a capacitor C, and a resistor R are connected in series in this order;

the sensor electrode is connected downstream of the coil L and upstream of the capacitor C;

the detection circuit outputs the determination voltage signal based on the electrical signal at a detection point downstream of the capacitor C and upstream of the resistor R; and the control unit detects the proximity of a human body to the sensor electrode, based on the determination voltage signal.

In a second aspect of the present invention relating to a human body detection method using a capacitive proximity sensor, the capacitive proximity sensor comprises:
an oscillation means, which outputs a high-frequency signal;
a sensor circuit to which a high-frequency signal is input, and which includes a sensor electrode;
a detection circuit, which outputs a determination voltage signal corresponding to the capacitance of the sensor electrode, based on an electrical signal output from the sensor circuit; and
a control unit,
wherein the sensor circuit has an LCR series resonance circuit, in which a coil L, a capacitor C, and a resistor R are connected in series in this order;
the sensor electrode is connected downstream of the coil L and upstream of the capacitor C;
the detection circuit outputs the determination voltage signal based on the electrical signal at a detection point downstream of the capacitor C and upstream of the resistor R; and
the control unit detects the proximity of a human body to the sensor electrode, based on the determination voltage signal; and
with $f_A$ being the resonance frequency of the sensor circuit when no object is in the proximity of the sensor electrode, and $f_B$ being the resonance frequency of the sensor circuit when a human body is in the proximity of the sensor electrode, where the relationship is $$f_B < f_A$$

a first detection frequency $f_1$ and a second detection frequency $f_2$, which satisfy the relationship $$f_B \leq f_1 < f_2 < f_A$$

are set;
with $V_1$ being the determination voltage signal upon having input the high-frequency signal at the first detection frequency $f_1$ to the sensor circuit, when no object is in the proximity of the sensor electrode, a first threshold value $V_{th1}$ which satisfies the relationship $$V_1 < V_{th1}$$

is set;
with $V_2$ being the determination voltage signal upon having input the high-frequency signal at the second detection frequency $f_2$ to the sensor circuit, when no object is in the proximity of the sensor electrode, a second threshold value $V_{th2}$ which satisfies the relationship $$V_2 < V_{th2}$$

is set; and
proximity of a human body to the sensor electrode is detected by detecting that, upon having input the high-frequency signal at the first detection frequency $f_1$ to the sensor circuit, the determination voltage signal has reached or exceeded the first threshold value $Vth_1$, or that, upon having input the high-frequency signal at the second detection frequency $f_2$ to the sensor circuit, the determination voltage signal has reached or exceeded the second threshold value $V_{th2}$.

In a third aspect of the present invention relating to a human body detection method using a capacitive proximity sensor, the capacitive proximity sensor comprises:
an oscillation means, which outputs a high-frequency signal;
a sensor circuit to which a high-frequency signal is input, and which includes a sensor electrode;
a detection circuit, which outputs a determination voltage signal corresponding to the capacitance of the sensor electrode, based on an electrical signal output from the sensor circuit; and
a control unit,
wherein the sensor circuit has an LCR series resonance circuit, in which a coil L, a capacitor C, and a resistor R are connected in series in this order;
the sensor electrode is connected downstream of the coil L and upstream of the capacitor C;
the detection circuit outputs the determination voltage signal based on the electrical signal at a detection point downstream of the capacitor C and upstream of the resistor R; and
the control unit detects the proximity of a human body to the sensor electrode, based on the determination voltage signal; and
with $f_A$ being the resonance frequency of the sensor circuit when no object is in the proximity of the sensor electrode, $f_B$ being the resonance frequency of the sensor circuit when a human body is in the proximity of the sensor electrode, and $f_W$ being the resonance frequency of the sensor circuit when water is in the proximity of the sensor electrode, where the relationship is $$f_W < f_B < f_A$$

a first detection frequency $f_1$ and a second detection frequency $f_2$, which satisfy the relationship $$f_W \leq f_1 \leq f_B < f_2 < f_A$$

are set;
with $V_{11}$ being the determination voltage signal upon having input the high-frequency signal at the first detection frequency $f_1$ to the sensor circuit, when no object is in the proximity of the sensor electrode, and
$V_{12}$ being the determination voltage signal upon having input the high-frequency signal at the first detection frequency $f_1$ to the sensor circuit, when water is in the proximity of the sensor electrode, a first threshold value $V_{th1}$ which satisfies the relationships $$V_{11} < V_{th1}$$

$$V_{12} < V_{th1}$$

is set;
with $V_{21}$ being the determination voltage signal upon having input the high-frequency signal at the second detection frequency $f_2$ to the sensor circuit, when no object is in the proximity of the sensor electrode, and
$V_{22}$ being the determination voltage signal upon having input the high-frequency signal at the second detection frequency $f_2$ to the sensor circuit, when water is in the proximity of the sensor electrode, a second threshold value $V_{th2}$ which satisfies the relationships $$V_{21} < V_{th2}$$

$$V_{22} < V_{th2}$$

is set; and
proximity of a human body to the sensor electrode is detected by detecting that upon having input the high-frequency signal at the first detection frequency $f_1$ to the sensor circuit, the determination voltage signal has reached or exceeded the first threshold value $V_{th1}$, or that, upon having input the high-frequency signal at the second detection frequency $f_2$ to the sensor circuit, the determination voltage signal has reached or exceeded the second threshold value $V_{th2}$.

With the capacitive proximity sensor of the present invention, the voltage of the sensor electrode is not directly input to the detection circuit, but rather the electrical signal at a specific detection point in the sensor circuit is input to the detection circuit, whereby the extremely small stray capacitance of the sensor electrode can be detected using a detection circuit having a comparatively low input impedance which is not easily affected by the environmental temperature change and noise. Furthermore, with the human body detection method of the present invention, proximity of a human body to the sensor electrode can be detected with higher accuracy.

DETAILED DESCRIPTION OF THE PREFERRED EMBODIMENTS

Hereafter, exemplary modes of embodiment of the present invention are described with reference to the drawings.

First Exemplary Mode of Embodiment

The capacitive proximity sensor according to the first exemplary mode of embodiment of the present invention can be used as a sensor for locking or unlocking the doors of a vehicle in a so-called keyless entry system. In this case, the sensor electrode is provided within a door handle, which serves as a manipulated member, and is disposed at a predetermined position so that proximity or contact can be detected when a user is in the proximity of, or contacts, a predetermined face of the door handle.

Figure 1:
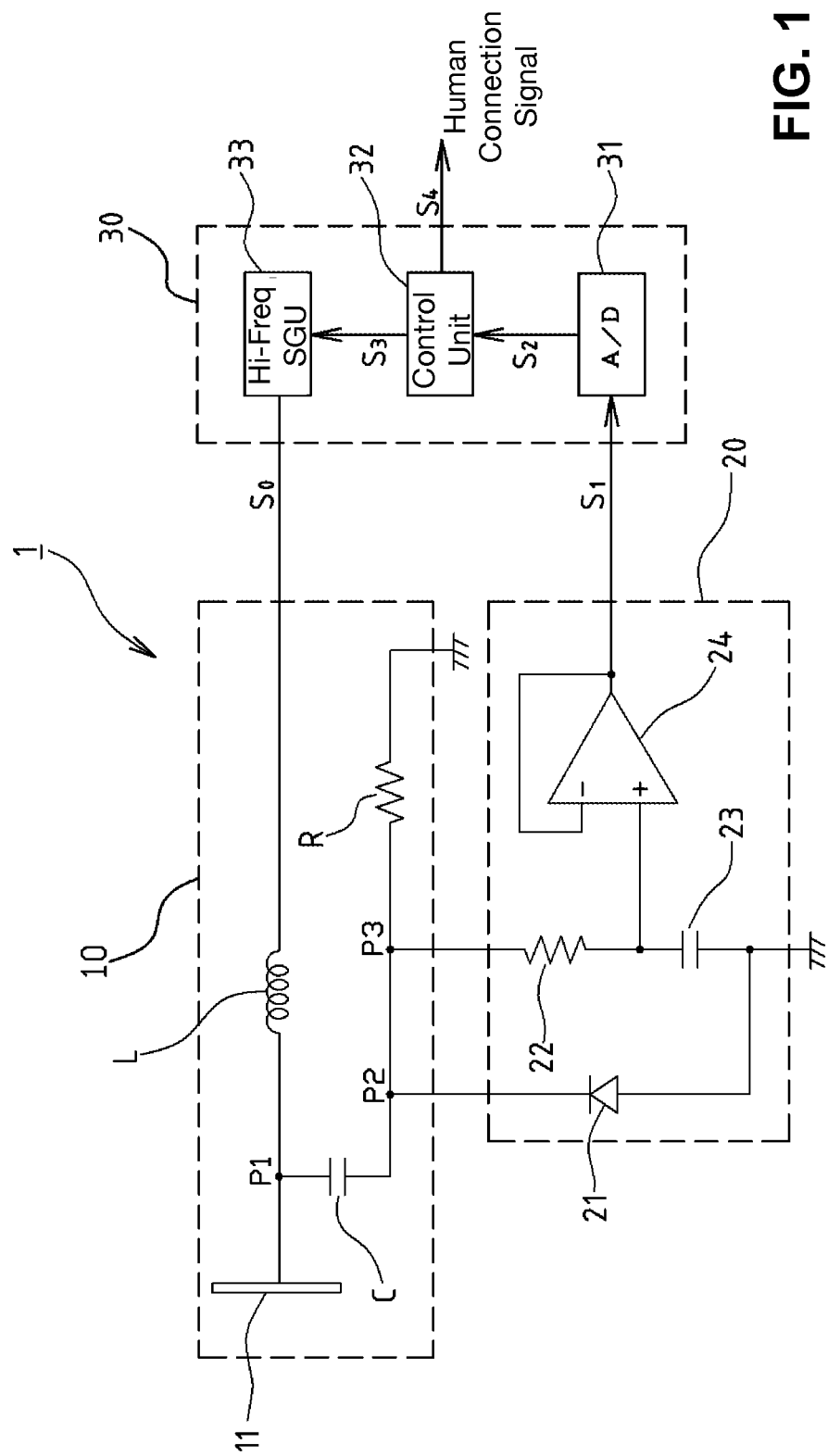
FIG. 1 is a block diagram showing the general configuration of a capacitive proximity sensor according to a first exemplary mode of embodiment of the present invention.

As shown in the block diagram in FIG. 1, the capacitive proximity sensor 1 of the present example principally comprises a sensor circuit 10, a detection circuit 20, and a microcomputer 30.

The sensor circuit 10 is provided with: an LCR series resonance circuit, in which a coil L, a capacitor C, and a resistor R are connected in series in this order; and a sensor electrode 11. The sensor electrode 11 is connected in parallel with the capacitor C at a sensor electrode connection point P1 downstream of the coil L and upstream of the capacitor C, and the capacitance thereof increases as a result of proximity of a human body or the like. The inductance of the coil L in the present example is 10 mH, the capacitance of the capacitor C is 7 pF, and the resistance of the resistor R is 470Ω, but these values can be set as appropriate.

The detection circuit 20 has a diode 21 for half-wave rectification, a fixed resistor 22 and a capacitor 23 constituting a low-pass filter, and an amplifier (buffer circuit) 24. This detection circuit 20 outputs a determination voltage signal $S_1$ corresponding to the capacitance of the sensor electrode 11, based on an electrical signal output from the sensor circuit 10. Specifically, the detection circuit 20 outputs the determination voltage signal $S_1$ based on the electrical signal at the detection point P3 downstream of the capacitor C and upstream of the resistor R. Note that a diode 21 is connected at a rectification point P2 between the capacitor C and the detection point P3. The detection circuit 20 can have any circuit configuration, so long as it outputs a determination voltage signal $S_1$ corresponding to the capacitance of the sensor electrode 11. Furthermore, by lowering the resistance value of the resistor R, it is possible to reduce the influence of noise.

If the voltage at the sensor electrode connection point P1 is input directly to the detection circuit as in the conventional capacitive proximity sensor, a detection circuit with extremely high input impedance is required. If the input impedance of the detection circuit is high, it will readily be affected by noise, temperature changes, and the like, and such that it will be difficult to detect slight changes in the stray capacitance of the sensor electrode with high reliability.

Meanwhile, by inputting the electrical signal to the detection circuit 20 at the detection point P3 downstream of the capacitor C and upstream of the resistor R in the sensor circuit 10, as in the present example, very small stray capacitance in the sensor electrode 11 can be detected using an inexpensive detection circuit with low input impedance. Specifically, in the proximity sensor 1 of present example, the current flowing in an LCR series resonance circuit is converted to a voltage and input to the detection circuit 20, wherein the detection circuit 20 is not directly connected to the sensor electrode 11. Therefore, the influence of the detection circuit 20 on the stray capacitance of the sensor electrode 11 is small, such that, even if the input impedance of the detection circuit 20 changes somewhat due to environmental temperature change or the like, the very small stray capacitance of the sensor electrode 11 can be detected.

The microcomputer 30 has an A/D converter 31, a control unit 32 and a high-frequency signal generation unit 33. The A/D converter 31 performs A/D conversion of the determination voltage signal $S_1$ input from the detection circuit 20, and outputs this to the control unit 32 as a determination signal $S_2$. As described in detail below, the control unit 32 outputs a control signal $S_3$ to the high-frequency signal generation unit 33, in addition to which, if it has been determined that a human body has contacted the door handle (is in the proximity of the sensor electrode 22) based on the determination signal $S_2$, the control unit 32 outputs a human detection signal $S_4$. The high-frequency signal generation unit 33, which serves as an oscillation means, will be described in detail below, but outputs a high-frequency signal $S_0$, having a predetermined frequency and a predetermined duty ratio, to the sensor circuit 10, on the basis of the control signal $S_3$, input from the control unit 32.

In present example, a rectangular-wave high-frequency signal (approximately several hundred kHz) is used as the high-frequency signal $S_0$. Note that the high-frequency signal $S_0$ is not limited to rectangular waves, but rather sine waves, triangular waves and the like may be used. The high-frequency signal $S_0$ input to the sensor circuit 10 is distorted by the coil L and the capacitor C (and the capacitance of the sensor electrode 11), and becomes a waveform that is nearly a sawtooth wave, in which the rising edge and the falling edge are delayed, which undergoes half-wave rectification by the diode 21. Furthermore, the electrical signal at the detection point P3 is smoothed by the fixed resistor 22 and the capacitor 23 constituting a low-pass filter, whereafter a determination voltage signal $S_1$ that is close to direct current is output via the buffer circuit 24.

Figure 2:
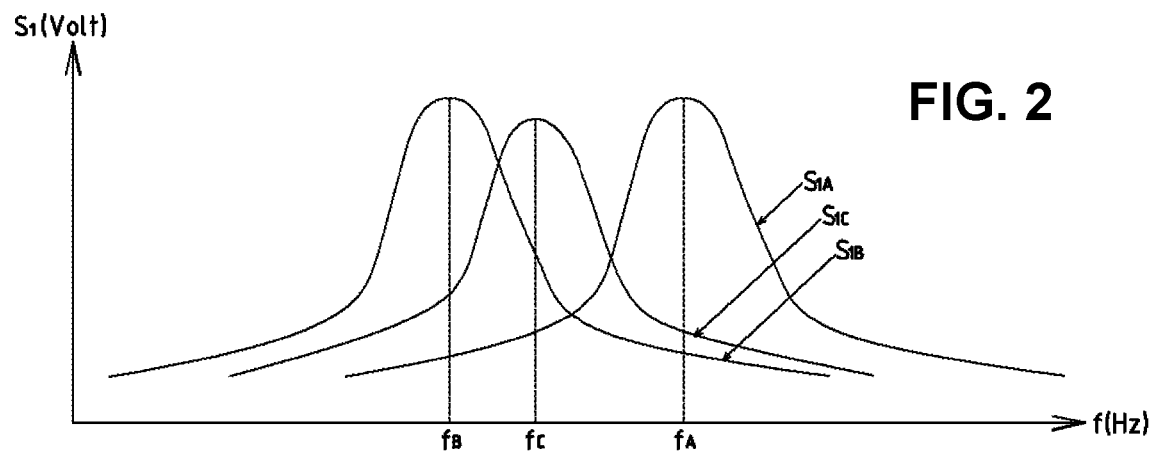
FIG. 2 is a graph showing relationships between the frequency f of a high-frequency signal $S_0$ and a determination voltage signal $S_1$ in a capacitive proximity sensor according to the first exemplary mode of embodiment of the present invention.

FIG. 2 shows the relationship between the frequency f of the high-frequency signal $S_0$ that is input to the sensor circuit 10 and the determination voltage signal $S_1$ when no object (human body or the like) is in the proximity of the sensor electrode 11 and when an object (human body or the like) is in the proximity of the sensor electrode 11. In FIG. 2, $S_{1A}$ is the graph when no object is in the proximity of the sensor electrode 11, $S_{1B}$ is the graph when a person with bare hands is in the proximity of the sensor electrode 11, and $S_{1C}$ is the graph when a person wearing thin gloves is in the proximity of the sensor electrode 11.

As shown in FIG. 2, the resonance frequency $f_B$ when a person with bare hands is in the proximity of the sensor electrode 11 is lower than the resonance frequency $f_A$ when no object is in the proximity of the sensor electrode 11. This is because the capacitance of the sensor electrode 11 increases when a human body approaches the sensor electrode 11. Furthermore, the resonance frequency $f_C$ when a person wearing thin gloves is in the proximity of the sensor electrode 11 is between $f_A$ and $f_B$. Note that, in the present example, $f_A$ is 270 kHz, $f_B$ is 250 kHz, and $f_C$ is 257 kHz.

Next, a method for detecting a person in the present example will be described.

First, if the relationship is such that $f_B < f_A$ as shown in FIG. 2, a first detection frequency $f_1$ and a second detection frequency $f_2$ that satisfy the relationship $f_B \leq f_1 < f_2 < f_A$ are set. Note that, in the present example, the first detection frequency $f_1$ is set to $f_B$ (250 kHz) and the second detection frequency $f_2$ is set to $f_C$ (257 kHz).

Furthermore, with $V_1$ being the determination voltage signal (the voltage at the point $P_{A1}$ in FIG. 3) upon having input a high-frequency signal at the first detection frequency $f_1$ to the sensor circuit 10, when no object is in the proximity of the sensor electrode 11, and $V_B$ being the determination voltage signal (the voltage at the point $P_B$ in FIG. 3) upon having input a high-frequency signal at the first detection frequency $f_1$ to the sensor circuit 10, when a person with bare hands is in the proximity of the sensor electrode 11, a first threshold value $V_{th1}$, which satisfies the relationship $$V_1 < V_{th1} \leq V_B$$

is set.

Note that, in the present example, $$V_{th1} = (V_1 + V_B)/2$$

is set. Specifically, $V_1$ is set to 1.00 V, $V_B$ is set to 2.00 V, and $V_{th1}$ is set to 1.50 V.

Furthermore, with $V_2$ being the determination voltage signal (the voltage at the point $P_{A2}$ in FIG. 4) upon having input a high-frequency signal at the second detection frequency $f_2$ to the sensor circuit 10, when no object is in the proximity of the sensor electrode 11, and $V_C$ being the determination voltage signal (the voltage at the point $P_C$ in FIG. 4) upon having input a high-frequency signal at the second detection frequency $f_2$ to the sensor circuit 10 when a person wearing thin gloves is in the proximity of the sensor electrode 11, a second threshold value $V_{th2}$ which satisfies the relationship $$V_2 < V_{th2} \leq V_C$$

is set.

Note that, in the present example, $$V_{th2} = (V_2 + V_C)/2$$

is set. Specifically, $V_2$ is set to 1.10 V, $V_C$ is set to 1.80 V, and $V_{th2}$ is set to 1.45 V.

Note that, the first detection frequency $f_1$, the second detection frequency $f_2$, the first threshold value $V_{th1}$ and the second threshold value $V_{th2}$ can be determined based on the data in FIG. 2, which is found beforehand, assuming a vehicle door including a door handle, in which the proximity sensor 1 is actually arranged, and the like, and stored in the microcomputer 30 in advance.

Figure 5:
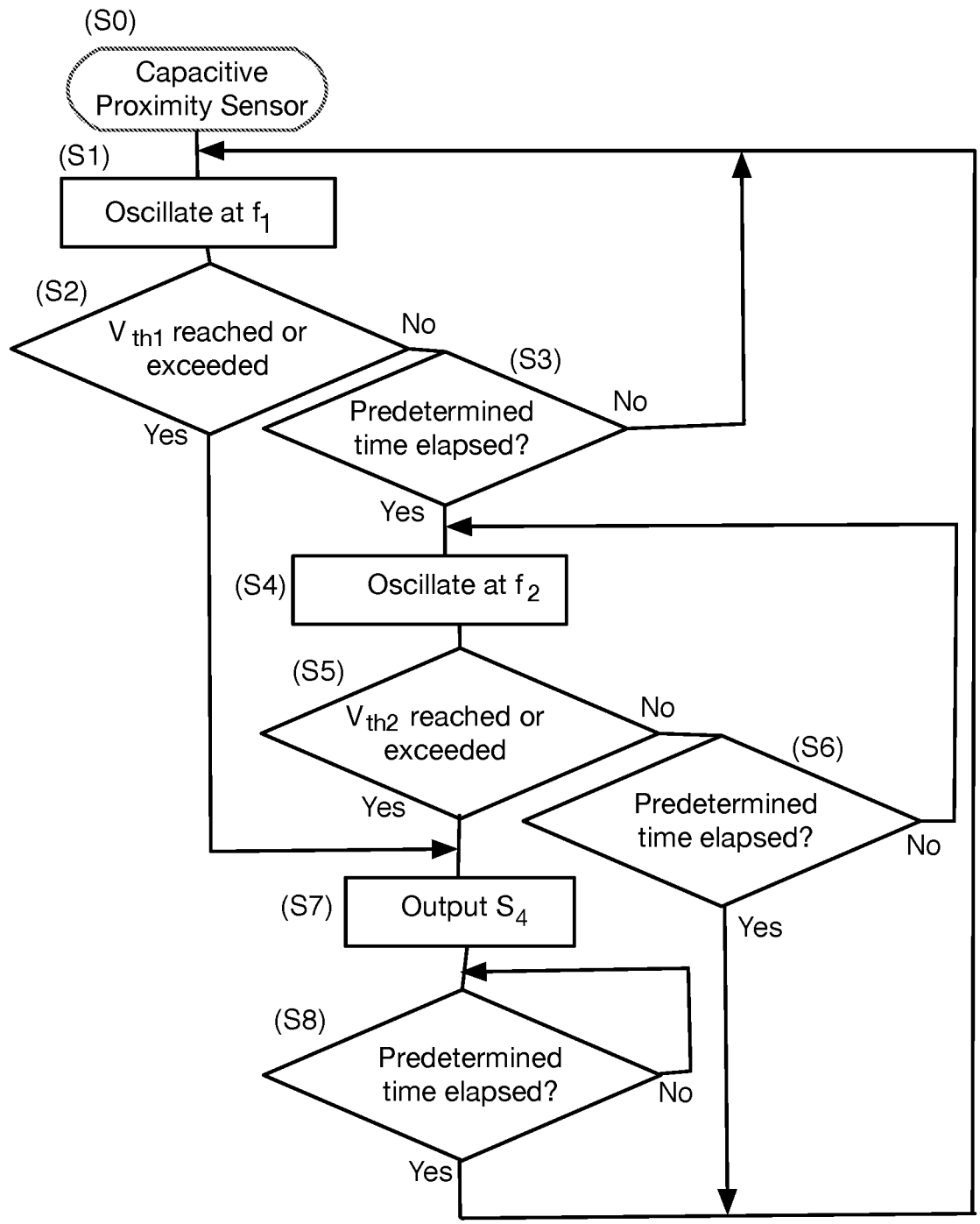
FIG. 5 is a flowchart serving to describe the detection processing performed in the capacitive proximity sensor according to the first exemplary mode of embodiment of the present invention.

Next, the operations for detection of a person with the proximity sensor 1 of present example will be described with reference to the flowchart in FIG. 5.

Step S0

First, if a user carrying an electronic key approaches the vehicle, wireless communication is performed between the authentication system installed in the vehicle and the electronic key, and this is authenticated as being an authorized electronic key for the vehicle. Note that, this authentication can be performed by known authentication methods for smart entry systems. Once this has been authenticated as being an authorized electronic key, detection of a human body is performed by the proximity sensor 1.

Step S1

The control unit 32 performs control so as to input the high-frequency signal $S_0$ at the first detection frequency $f_1$ (250 kHz) to the sensor circuit 10, from the high-frequency signal generation unit 33.

Steps S2 and S3

In these steps, a determination is made as to whether or not a person with bare hands has approached or made contact with the sensor electrode 11, within a predetermined time.

Figure 3:
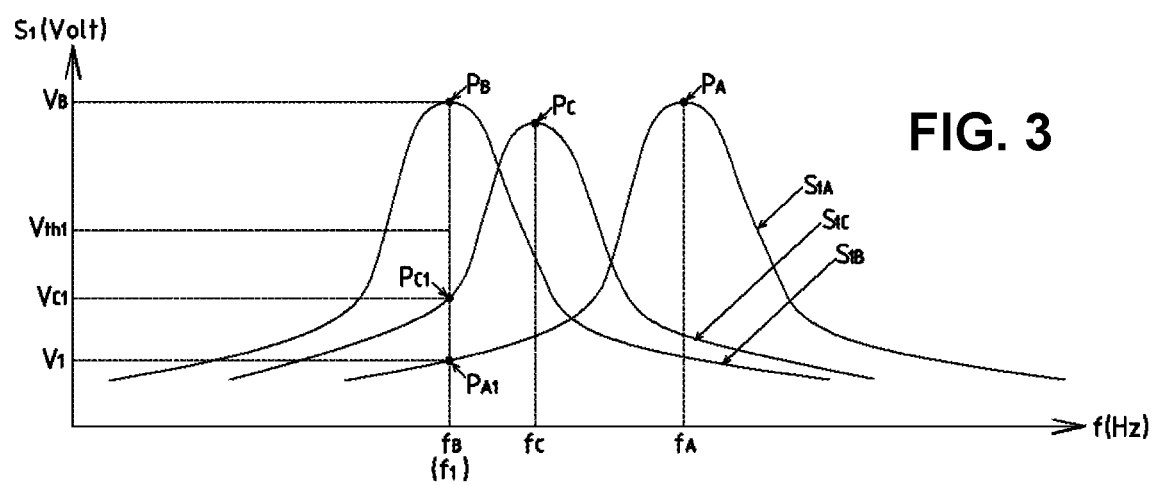
FIG. 3 is a graph serving to describe the determination voltage signal $S_1$ upon having input a high-frequency signal at a first detection frequency $f_1$ to the sensor circuit in the first exemplary mode of embodiment of the present invention.

Upon having input a high-frequency signal $S_0$ at the first detection frequency $f_1$ to the sensor circuit 10, if a person with bare hands approaches the sensor electrode 11 within a predetermined time, the determination voltage signal $S_1$ changes from $V_1$ to $V_B$, as shown in FIG. 3. If the determination voltage signal $S_1$ reaches or exceeds the first threshold value $V_{th1}$ in the course of the determination voltage signal $S_1$ changing in this way, the processing proceeds to step S7.

Meanwhile, upon having input the high-frequency signal $S_0$ at the first detection frequency $f_1$ to the sensor circuit 10, if the determination voltage signal $S_1$ does not reach or exceed the first threshold value $V_{th1}$ within the predetermined time, the processing proceeds to step S4.

Step S4

The control unit 32 performs control so as to input the high-frequency signal $S_0$ at the second detection frequency $f_2$ (257 kHz) to the sensor circuit 10, from the high-frequency signal generation unit 33.

Steps S5 and S6

In these steps, a determination is made as to whether or not a person wearing thin gloves has approached or made contact with the sensor electrode 11, within a predetermined time.

Figure 4:
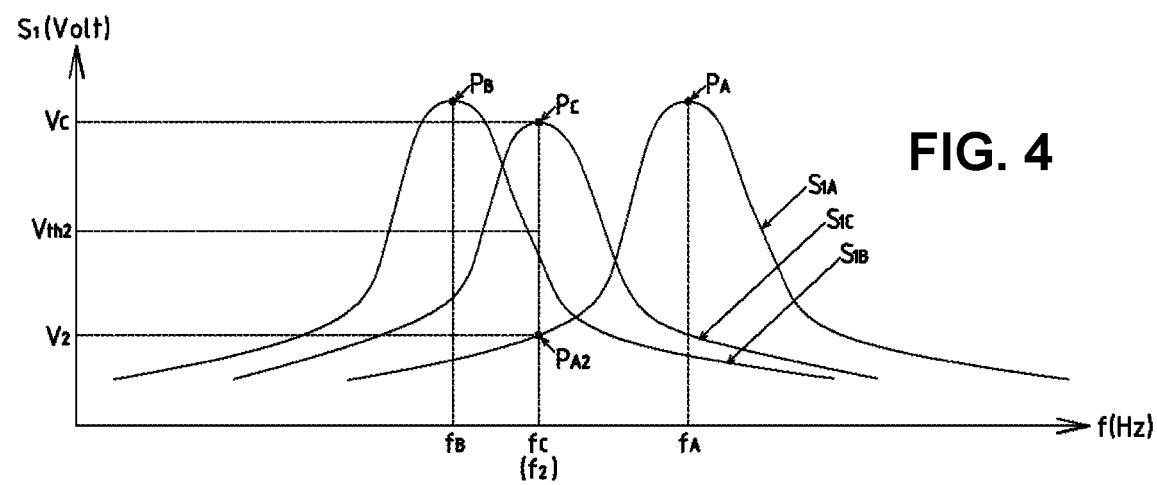
FIG. 4 is a graph serving to describe the determination voltage signal $S_1$ upon having input a high-frequency signal at a second detection frequency $f_2$ to the sensor circuit in the first exemplary mode of embodiment of the present invention.

Upon having input the high-frequency signal $S_0$ at the second detection frequency $f_2$ to the sensor circuit 10, if a person wearing thin gloves is in the proximity of the sensor electrode 11 within a predetermined time, the determination voltage signal $S_1$ changes to $V_C$, as shown in FIG. 4. If the determination voltage signal $S_1$ reaches or exceeds the second threshold value $V_{th2}$ in the course of the determination voltage signal $S_1$ changing in this way, the processing proceeds to step S7.

Meanwhile, upon having input the high-frequency signal $S_0$ at the second detection frequency $f_2$ to the sensor circuit 10, if the determination voltage signal $S_1$ does not reach or exceed the second threshold value $V_{th2}$ within the predetermined time, the processing returns to step S1.

Step S7

If the determination voltage signal $S_1$ has reached or exceeded the first threshold value $V_{th1}$ in step S2, or the determination voltage signal $S_1$ has reached or exceeded the second threshold value $V_{th2}$ in step S5, it is determined that a person has touched the door handle (a person is in the proximity of the sensor electrode 11), and a human detection signal $S_4$ is output.

Note that, when the human detection signal $S_4$ is output, a door lock mechanism provided in the outer panel of the door is controlled so as to unlock or lock the vehicle door.

Step S8

After a predetermined time (1 second in the present example) has elapsed, the process returns to step S1.

As described above, in the capacitive proximity sensor 1 of the present example, the resonance frequency of the sensor circuit 10 changes as shown in FIG. 2, when no object is in the proximity of the sensor electrode 11, when approached by the bare hand of a person, and when approached by a person in a thin gloved state. Consequently, for example, in a method in which it is determined that a human body has touched the door handle only when the determination voltage signal $S_1$ has reached or exceeded the first threshold value $V_{th1}$ upon having input the high-frequency signal $S_0$ at the first detection frequency $f_1$ to the sensor circuit 10, because $V_{C1}$ (voltage of the point $P_{C1}$) in FIG. 3 is lower than $V_{th1}$, a touch by a person wearing gloves cannot be detected. Note that $V_{C1}$ is the determination voltage signal when a person wearing thin gloves is in the proximity of the sensor electrode 11 upon having input the high-frequency signal $S_0$ at the first detection frequency $f_1$ to the sensor circuit 10.

Here, in the capacitive proximity sensor 1 of the present example, the first detection frequency $f_1$ is set to $f_B$, and the second detection frequency $f_2$ is set to $f_C$, while the first threshold value $V_{th1}$ is set to an intermediate value between $V_1$ and $V_B$, and the second threshold value $V_{th2}$ is set to an intermediate value between $V_2$ and $V_C$. Furthermore, if the determination voltage signal $S_1$ has reached or exceeded the first threshold value $V_{th1}$ upon having input the high-frequency signal $S_0$ at the first detection frequency $f_1$ to the sensor circuit 10, or the determination voltage signal $S_1$ has reached or exceeded the second threshold value $V_{th2}$ upon having input the high-frequency signal $S_0$ at the second detection frequency $f_2$ to the sensor circuit 10, it is determined that a human body has touched the door handle (a human body is in the proximity of the sensor electrode 11) and a human detection signal $S_4$ is output. As a result, proximity to the sensor electrode 11 can be detected not only with the bare hands of a person but also in a thin gloved state.

Note that, in the present example, the second detection frequency $f_2$ is input after inputting the first detection frequency $f_1$, but the first detection frequency $f_1$ may be input after inputting the second detection frequency $f_2$. That is to say, the order of steps S1, S2 and of steps S4, S5 may be switched.

Furthermore, in the present example, the first detection frequency $f_1$ is set to $f_B$ and the second detection frequency $f_2$ is set to $f_C$, but so long as $f_B \leq f_1 < f_2 < f_A$ is satisfied, $f_1$ and $f_2$ may be set arbitrarily.

Furthermore, in the present example, $$V_{th1}=(V_1+V_B)/2$$

$$V_{th2}=(V_2+V_C)/2$$

are set, but $V_{th1}$ and $V_{th2}$ may be arbitrarily set so long as approach by the bare hand of a person can be detected using $V_{th1}$ and approach in a thin gloved state can be detected using $V_{th2}$.

Second Exemplary Mode of Embodiment

The capacitive proximity sensor according to the second exemplary mode of embodiment of the present invention has the same configuration as that of the first exemplary mode of embodiment. In the first exemplary mode of embodiment, the high-frequency signals at the first detection frequency $f_1$ and the second detection frequency $f_2$ are input to the sensor circuit in order to detect approach by bare hands and thin gloves but, the present example differs from the first exemplary mode of embodiment in that approach by thick gloves can also be detected.

Figure 6:
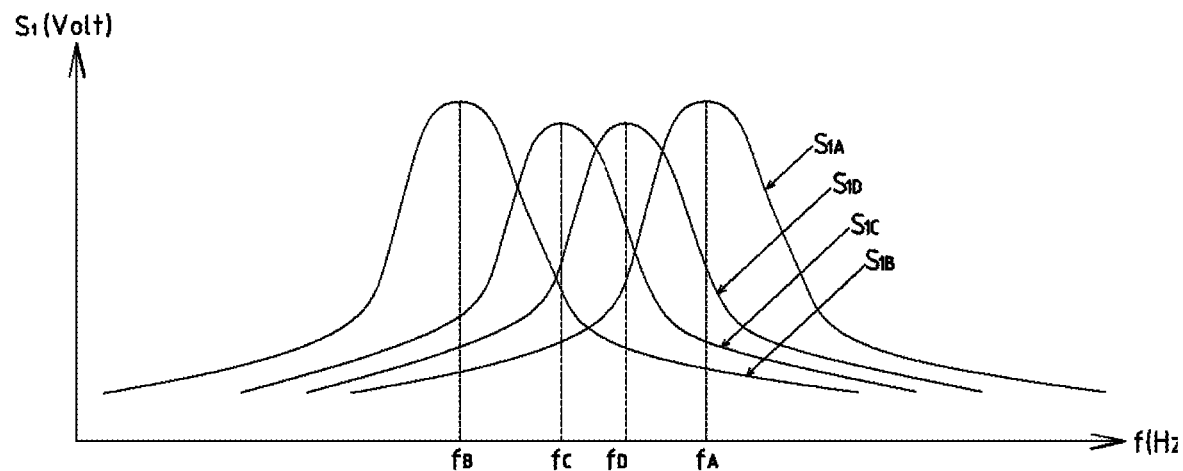
FIG. 6 is a graph showing relationships between the frequency f of a high-frequency signal $S_0$ and the determination voltage signal $S_1$ in the capacitive proximity sensor according to the second exemplary mode of embodiment of the present invention.

FIG. 6 shows the relationship between the frequency f of the high-frequency signal $S_0$ and the determination voltage signal $S_1$ in the proximity sensor of present example, and in addition to the graphs in FIG. 2, a graph $S_{1D}$ has been added for the situation in which a person wearing thick gloves is in the proximity of the sensor electrode 11. As shown in FIG. 6, the resonance frequency $f_D$ when a person wearing thick gloves is in the proximity of the sensor electrode 11 is between $f_A$ and $f_C$. Note that, in the present example, $f_A$ is 270 kHz, $f_B$ is 250 kHz, $f_C$ is 257 kHz, and $f_D$ is 264 kHz.

Next, a method for detecting a person in the present example will be described.

First, if the relationship is such that $f_B < f_A$ as shown in FIG. 6, a first detection frequency $f_1$, a second detection frequency $f_2$, and a third detection frequency $f_3$ that satisfy the relationship $f_B \leq f_1 < f_2 < f_3 < f_A$ are set. In the present example, the first detection frequency $f_1$ is set to $f_B$ (250 kHz), the second detection frequency $f_2$ is set to $f_C$ (257 kHz), and the third detection frequency $f_3$ is set to $f_D$ (264 kHz). Thus, in the present example, for the second detection frequency in the first exemplary mode of embodiment, a plurality of mutually differing frequencies are set (which is to say, a second detection frequency and a third detection frequency).

Figure 7:
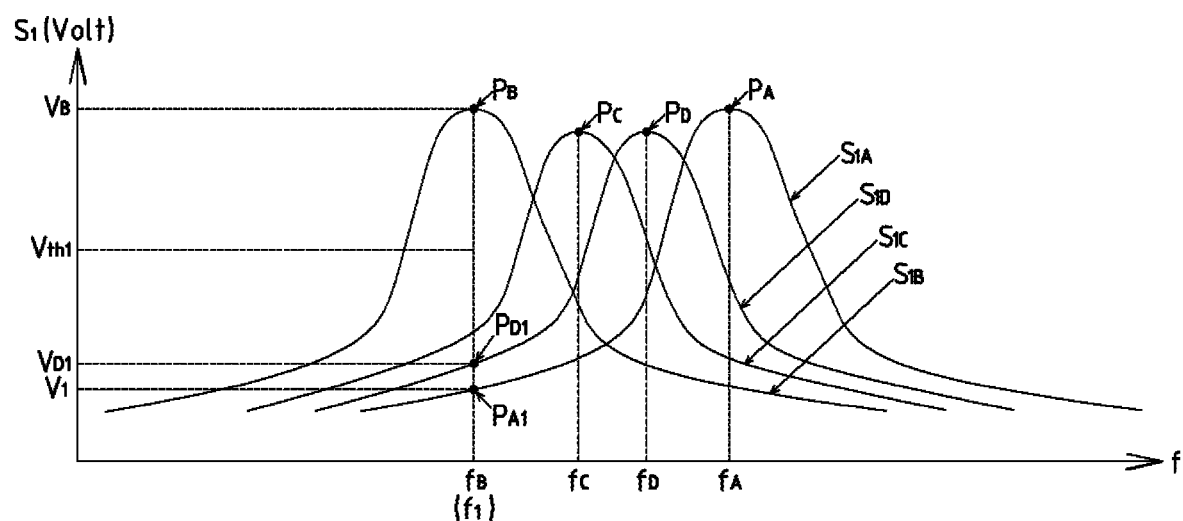
FIG. 7 is a graph serving to describe the determination voltage signal $S_1$ upon having input a high-frequency signal at a first detection frequency $f_1$ to the sensor circuit in the second exemplary mode of embodiment of the present invention.
Figure 8:
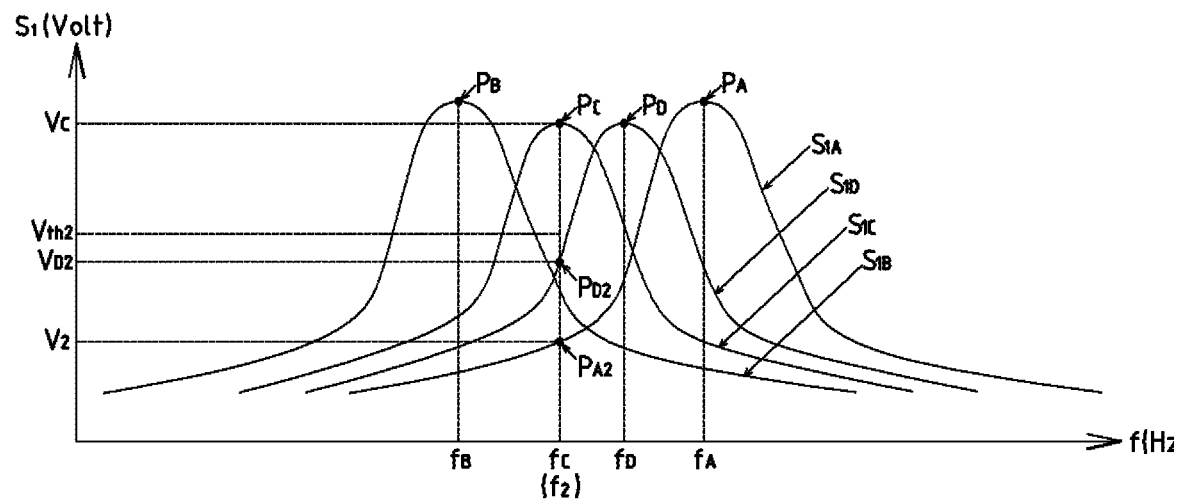
FIG. 8 is a graph serving to describe the determination voltage signal $S_1$ upon having input a high-frequency signal at a second detection frequency $f_2$ to the sensor circuit in the second exemplary mode of embodiment of the present invention.

The method of setting the first detection frequency $f_1$, the second detection frequency $f_2$, the first threshold value $V_{th1}$ and the second threshold value $V_{th2}$ in the present example is the same as in the first exemplary mode of embodiment (see FIGS. 7 and 8).

Furthermore, with $V_3$ being the determination voltage signal (the voltage at the point $P_{A3}$ in FIG. 9) upon having input the high-frequency signal at the third detection frequency $f_3$ to the sensor circuit 10, when no object is in the proximity of the sensor electrode 11, and $V_D$ being the determination voltage signal (the voltage at the point $P_D$ in FIG. 9) upon having input the high-frequency signal at the third detection frequency $f_3$ to the sensor circuit 10, when a person wearing thick gloves is in the proximity of the sensor electrode 11, a third threshold value $V_{th3}$, which satisfies the relationship $$V_3 < V_{th3} \leq V_D$$

is set.
Note that, in the present example, $$V_{th3} = (V_3 + V_D)/2$$

is set. Specifically, $V_3$ is set to 1.40 V, $V_D$ is set to 1.80 V, and $V_{th2}$ is set to 1.60 V.

Note that, the first detection frequency $f_1$, the second detection frequency $f_2$, the third detection frequency $f_3$, the first threshold value $V_{th1}$, the second threshold value $V_{th2}$, and the third threshold value $V_{th3}$ can be determined based on the data in FIG. 6, which is found beforehand, assuming a vehicle door including a door handle, in which the proximity sensor 1 is actually arranged, and the like, and stored in the microcomputer 30 in advance.

Next, the operations for detection of a person with the proximity sensor of the present example will be described with reference to the flowchart in FIG. 10.

Steps S10 to S16
Steps S10 to S16 are the same as steps S0 to S6 in the first exemplary mode of embodiment.

Step S17
If the determination voltage signal $S_1$ does not reach or exceed the second threshold value $V_{th2}$ within the predetermined time in step S15, the control unit 32 performs control so that the high-frequency signal $S_0$ at the third detection frequency $f_3$ (264 kHz) is input to the sensor circuit 10, from the high-frequency signal generation unit 33.

Figure 9:
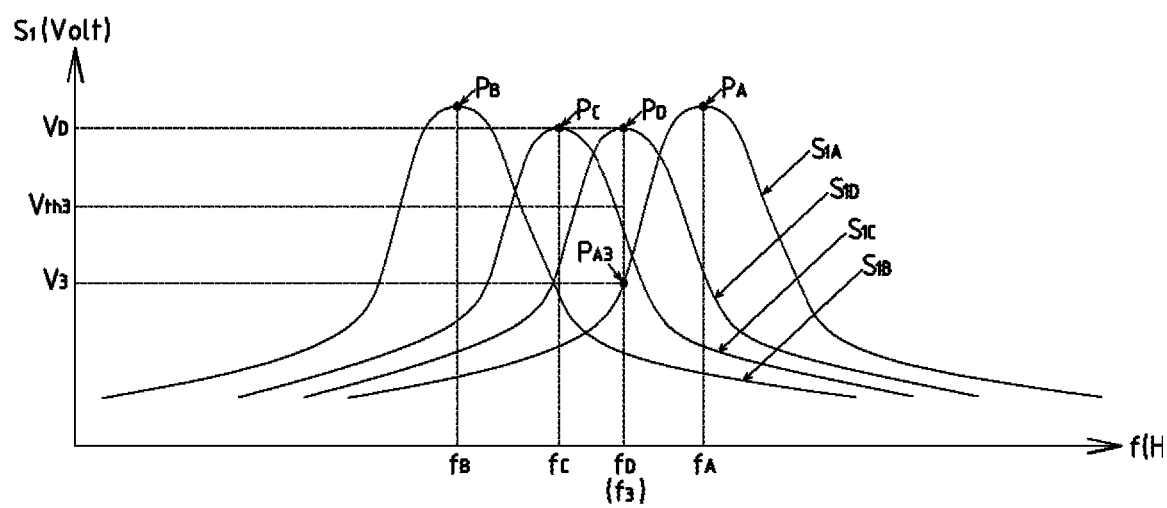
FIG. 9 is a graph serving to describe the determination voltage signal $S_1$ upon having input a high-frequency signal at a third detection frequency $f_3$ to the sensor circuit in the second exemplary mode of embodiment of the present invention.

Steps S18 and S19
In these steps, a determination is made as to whether or not a person wearing thick gloves has approached or made contact with the sensor electrode 11, within a predetermined time. Upon having input a high-frequency signal $S_0$ at the third detection frequency $f_3$ to the sensor circuit 10, if a person wearing thick gloves is in the proximity of the sensor electrode 11 within a predetermined time, the determination voltage signal $S_1$ changes to $V_D$ (1.80 V), as shown in FIG. 9. If the determination voltage signal $S_1$ reaches or exceeds the third threshold value $V_{th3}$ (1.60 V) in the course of the determination voltage signal $S_1$ changing in this way, the processing proceeds to step S20. Meanwhile, upon having input the high-frequency signal $S_0$ at the third detection frequency $f_3$ to the sensor circuit 10, if the determination voltage signal $S_1$ does not reach or exceed the third threshold value $V_{th3}$ (1.60 V) within the predetermined time, the processing returns to step S11.

Step S20
If the determination voltage signal $S_1$ has reached or exceeded the first threshold value $V_{th1}$ (1.50 V) in step S12, or the determination voltage signal $S_1$ has reached or exceeded the second threshold value $V_{th2}$ (1.45 V) in step S15, or the determination voltage signal $S_1$ has reached or exceeded the third threshold value $V_{th2}$ (1.60 V) in step S18, it is determined that a person has touched the door handle (a person is in the proximity of the sensor electrode 11) and a human detection signal $S_4$ is output.

Step S21
After a predetermined time has elapsed, the process returns to step S11.

As described above, in the capacitive proximity sensor of the present example, the resonance frequency changes as shown in FIG. 6, when no object is in the proximity of the sensor electrode 11, when approached by the bare hand of a person, when approached in a thin gloved state, and when approached in a thick gloved state. Consequently, in the detection method of the first exemplary mode of embodiment, $V_{D1}$ (the voltage at the point $P_{D1}$) in FIG. 7 will be lower than $V_{th1}$, and fBrther $V_{D2}$ (the voltage at the point $P_{D2}$) in FIG. 8 will be lower than $V_{th2}$, such that contact by a person wearing thick gloves cannot be detected. Note that $V_{D1}$ is the determination voltage signal when a person wearing thick gloves is in the proximity of the sensor electrode 11 upon having input the high-frequency signal $S_0$ at the first detection frequency $f_1$ to the sensor circuit 10. Furthermore, $V_{D2}$ is the determination voltage signal when a person wearing thick gloves is in the proximity of the sensor electrode 11 upon having input the high-frequency signal $S_0$ at the second detection frequency $f_2$ to the sensor circuit 10.

Here, in the capacitive proximity sensor of the present example, the first detection frequency $f_1$ is set to $f_B$, the second detection frequency $f_2$ is set to $f_C$, and the third detection frequency $f_3$ is set to $f_D$, while the first threshold value $V_{th1}$ is set to an intermediate value between $V_1$ and $V_B$, the second threshold value $V_{th2}$ is set to an intermediate value between $V_2$ and $V_C$, and the third threshold value $V_{th3}$ is set to an intermediate value between $V_3$ and $V_D$. Furthermore, if the determination voltage signal $S_1$ has reached or exceeded the first threshold value $V_{th1}$ upon having input the high-frequency signal $S_0$ at the first detection frequency $f_1$ to the sensor circuit 10, or the determination voltage signal $S_1$ has reached or exceeded the second threshold value $V_{th2}$ upon having input the high-frequency signal $S_0$ at the second detection frequency $f_2$ to the sensor circuit 10, or the determination voltage signal $S_1$ has reached or exceeded the third threshold voltage $V_{th3}$ upon having input the high-frequency signal $S_0$ at the third detection frequency $f_3$ to sensor circuit 10, it is determined that a person has touched the door handle (a person is in the proximity of the sensor electrode 11) and a human detection signal $S_4$ is output. As a result, proximity to the sensor electrode 11 can be detected not only with the bare hands of a person but also in a thin gloved, or thick gloved state.

Note that, in the present example, the first detection frequency $f_1$, the second detection frequency $f_2$, and the third detection frequency $f_3$ are input in this order, but as in the first exemplary mode of embodiment, the order for these may be switched. That is to say, the order of steps S11 and S12, steps S14 and S15, and steps S17 and S18 may be switched.

Furthermore, in the present example, the first detection frequency $f_1$ is set to $f_B$, the second detection frequency $f_2$ is set to $f_C$ and the third detection frequency $f_3$ is set to $f_D$, but so long as $f_B \leq f_1 < f_2 < f_3 < f_A$ is satisfied, $f_1$, $f_2$ and $f_3$ may be set arbitrarily.

Furthermore, in the present example, $$V_{th1} = (V_1 + V_B)/2$$

$$V_{th2} = (V_2 + V_C)/2$$

$$V_{th3} = (V_3 + V_D)/2$$

were set, but so long as approach by the bare hand of a person can be detected using $V_{th1}$, approach in a thin gloved state can be detected using $V_{th2}$, and approach in a thick gloved state can be detected using $V_{th3}$, $V_{th1}$ $V_{th2}$ and $V_{th3}$ can be arbitrarily set.

Third Exemplary Mode of Embodiment

The capacitive proximity sensor according to the third exemplary mode of embodiment of the present invention has the same configuration as that of the first exemplary mode of embodiment. Generally, in capacitive proximity sensors, there are methods in which the sensitivity is decreased so as not to react to water but, in these methods, there are problems in that detection cannot be achieved in a thick gloved state or with a hand or a foot that is distanced from the sensor. The proximity sensor in the present example is made capable of detecting only people, without detecting the water, and without lowering the sensitivity of the sensor.

Figure 11:
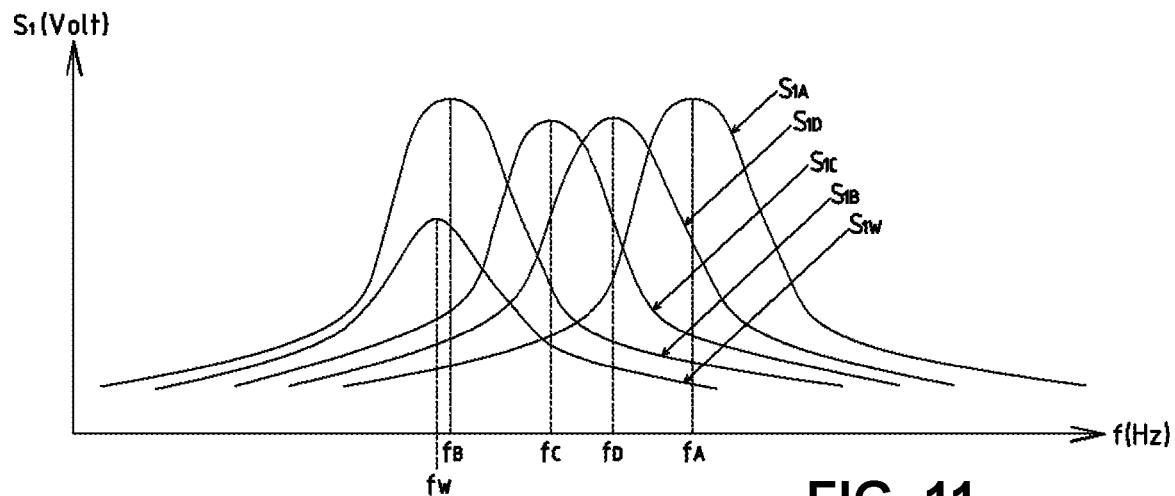
FIG. 11 is a graph showing relationships between the frequency f of a high-frequency signal $S_0$ and the determination voltage signal $S_1$ in the capacitive proximity sensor according to the third exemplary mode of embodiment of the present invention.

FIG. 11 shows the relationship between the frequency f of the high-frequency signal $S_0$ and the determination voltage signal $S_1$ in the proximity sensor of the present example, and in addition to the graphs in FIG. 6, a graph $S_{1w}$ has been added for the situation in which a relatively large amount of water is in the proximity of the sensor electrode 11, supposing the vehicle is being washed.

As shown in FIG. 11, the resonance frequency $f_W$ when a large amount of water is in the proximity of the sensor electrode 11 is lower than $f_B$. Note that, in the present example, $f_A$ is 270 kHz, $f_B$ is 250 kHz, $f_C$ is 257 kHz, $f_D$ is 264 kHz, and $f_W$ is 248 kHz.

Next, a method for detecting a person in the present example will be described.

First, if the relationship is such that $f_W < f_B < f_A$ as shown in FIG. 11, a first detection frequency $f_1$, a second detection frequency $f_2$, and a third detection frequency $f_3$ that satisfy the relationship $f_W \leq f_1 \leq f_B < f_2 < f_3 < f_A$ are set. In the present example, the first detection frequency $f_1$ is set to $f_W$ (248 kHz), the second detection frequency $f_2$ is set to $f_C$ (257 kHz), and the third detection frequency $f_3$ is set to $f_D$ (264 kHz).

Thus, the present example corresponds changing the first detection frequency $f_1$ from $f_A$ to $f_W$ in the second exemplary mode of embodiment.

Figure 12:
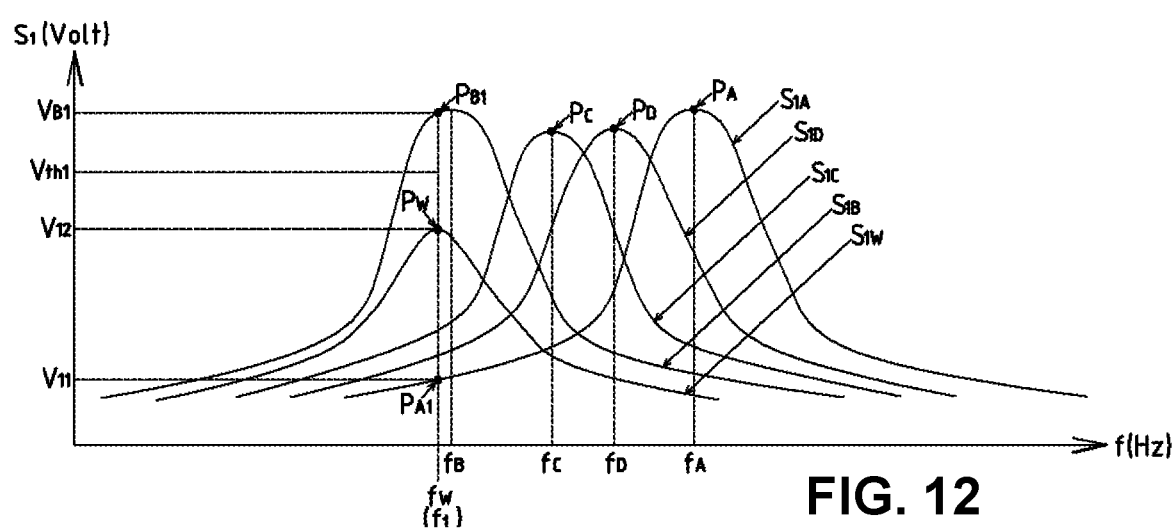
FIG. 12 is a graph serving to describe the determination voltage signal $S_1$ upon having input a high-frequency signal at a first detection frequency $f_1$ to the sensor circuit in the third exemplary mode of embodiment of the present invention.

Furthermore, with $V_{11}$ being the determination voltage signal (the voltage at the point $P_{A1}$ in FIG. 12) upon having input the high-frequency signal at the first detection frequency $f_1$ to the sensor circuit 10, when no object is in the proximity of the sensor electrode 11, $V_{12}$ being the determination voltage signal (the voltage at the point $P_W$ in FIG. 12) upon having input the high-frequency signal at the first detection frequency $f_1$ to the sensor circuit 10, when water is in the proximity of sensor electrode 11, and $V_{B1}$ being the determination voltage signal (the voltage at the point $P_{B1}$ in FIG. 12) upon having input the high-frequency signal at the first detection frequency $f_1$ to the sensor circuit 10, when a person with bare hands is in the proximity of the sensor electrode 11, a first threshold value $V_{th1}$ which satisfies the relationships $$V_{11} < V_{th1} \leq V_{B1}$$

$$V_{12} < V_{th1} \leq V_{B1}$$

is set.

Note that, in the present example, because $V_{11} < V_{12}$, $$V_{th1} = (V_{12} + V_{B1})/2$$

is set. Specifically, $V_{12}$ is 1.55 V, $V_{B1}$ is 1.95 V, and $V_{th1}$ is set to 1.75 V.

Figure 13:
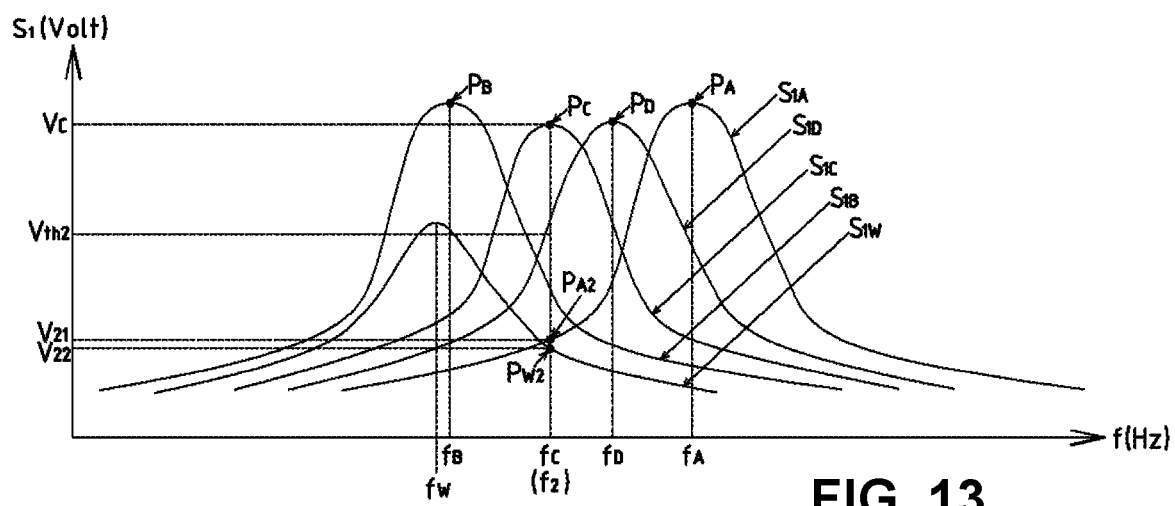
FIG. 13 is a graph serving to describe the determination voltage signal $S_1$ upon having input a high-frequency signal at a second detection frequency $f_2$ to the sensor circuit in the third exemplary mode of embodiment of the present invention.

Furthermore, with $V_{21}$ being the determination voltage signal (the voltage at the point $P_{A2}$ in FIG. 13) upon having input the high-frequency signal at the second detection frequency $f_2$ to the sensor circuit 10, when no object is in the proximity of the sensor electrode 11, $V_{22}$ being the determination voltage signal (the voltage at the point $P_{w2}$ in FIG. 13) upon having input the high-frequency signal at the second detection frequency $f_2$ to the sensor circuit 10, when water is in the proximity of the sensor electrode 11, and $V_C$ being the determination voltage signal (the voltage at the point $P_C$ in FIG. 13) upon having input the high-frequency signal at the second detection frequency $f_2$ to the sensor circuit 10, when a person wearing thin gloves is in the proximity of the sensor electrode 11, a second threshold value $V_{th2}$ which satisfies the relationships $$V_{21} < V_{th2} \leq V_C$$

$$V_{22} < V_{th2} \leq V_C$$

is set.

Note that in the present example, since $V_{22} < V_{21}$, $$V_{th2} = (V_{21} + V_C)/2$$

is set. Specifically, $V_{21}$ is 1.20 V, $V_C$ is 1.80 V, and $V_{th2}$ is set to 1.50 V.

Furthermore, with $V_{31}$ being the determination voltage signal (the voltage at the point $P_{A3}$ in FIG. 14) upon having input the high-frequency signal at the third detection frequency $f_3$ to the sensor circuit 10, when no object is in the proximity of the sensor electrode 11, $V_{32}$ being the determination voltage signal (the voltage at the point $P_{w3}$ in FIG. 14) upon having input the high-frequency signal at the third detection frequency $f_3$ to the sensor circuit 10, when water is in the proximity of the sensor electrode 11, and $V_D$ being the determination voltage signal (the voltage of the point $P_D$ in FIG. 14) upon having input the high-frequency signal at the third detection frequency $f_3$ to the sensor circuit 10, when a person wearing thick gloves is in the proximity of the sensor electrode 11, a third threshold value $V_{th3}$ which satisfies a relationships $$V_{31} < V_{th3} \leq V_D$$

$$V_{32} < V_{th3} \leq V_D$$

is set.

Note that in the present example, since $V_{32} < V_{31}$, $$V_{th3} = (V_{31} + V_D)/2$$

is set. Specifically, $V_{31}$ is 1.40 V, $V_D$ is 1.80 V, and $V_{th3}$ is set to 1.60 V.

Note that, the first detection frequency $f_1$, the second detection frequency $f_2$, the third detection frequency $f_3$, the first threshold value $V_{th1}$, the second threshold value $V_{th2}$, and the third threshold value $V_{th3}$ can be determined based on the data in FIG. 11, which is found beforehand, assuming a vehicle door including a door handle, in which the proximity sensor 1 is actually arranged, and the like, and stored in the microcomputer 30 in advance.

Figure 10:
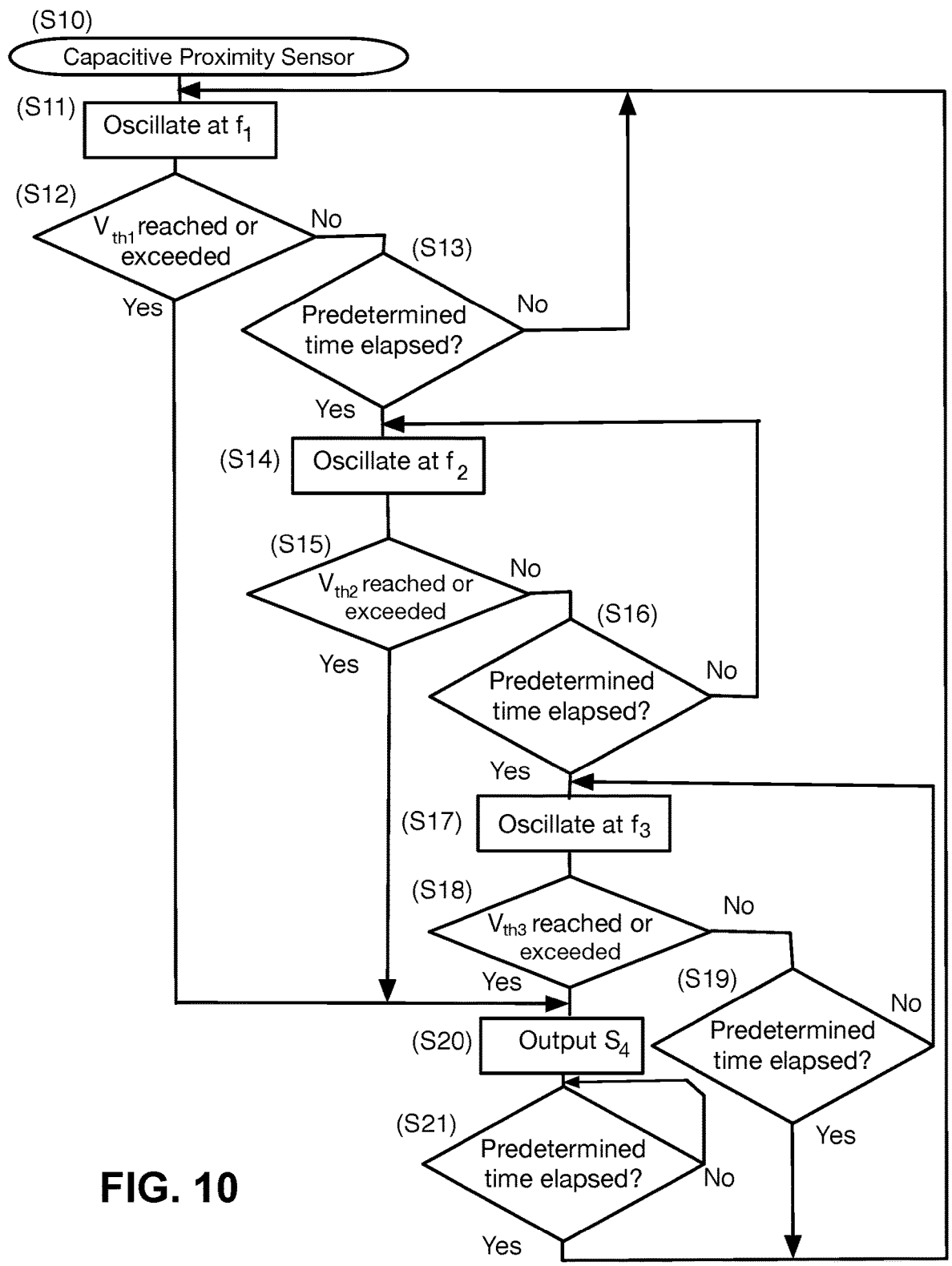
FIG. 10 is a flowchart serving to describe the detection processing performed in the capacitive proximity sensor according to the second exemplary mode of embodiment of the present invention.

The operations of detecting a person with the proximity sensor of the present example are exactly the same as in the flowchart in FIG. 10 in the second exemplary mode of embodiment, and thus description thereof will be omitted.

Figure 15:
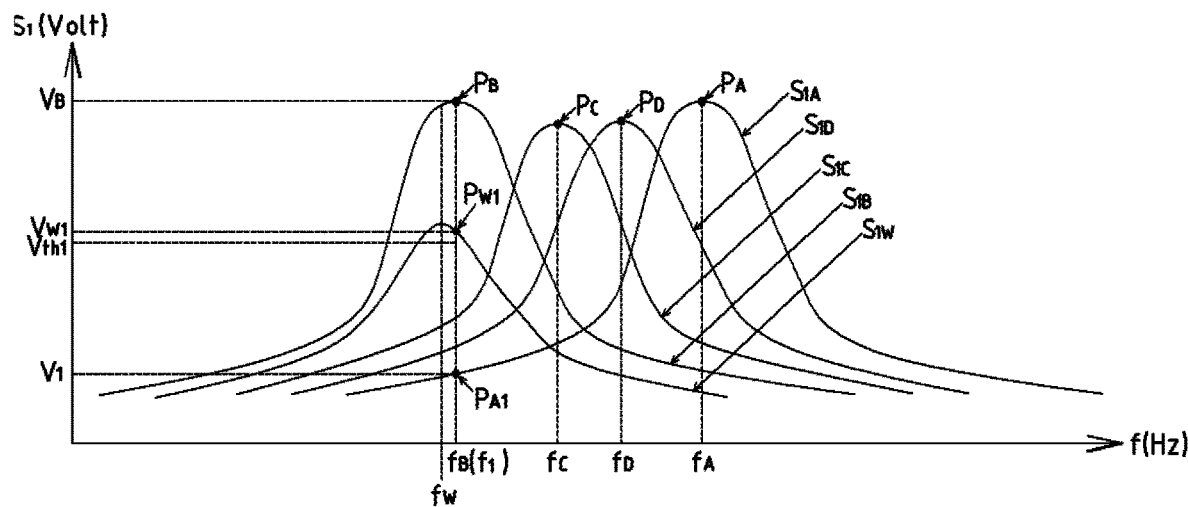
FIG. 15 is a graph serving to describe a method for detecting a person in the third exemplary mode of embodiment of the present invention.

In the capacitive proximity sensor 1 of the present example, the resonance frequency changes as shown in FIG. 11, when no object is in the proximity of the sensor electrode 11, when approached by the bare hand of a person, when approached in a thin gloved state, when approached in a thick gloved state, and when approached by water. Therefore, if the first detection frequency $f_1$ is set to $f_B$ and the first threshold value $V_{th1}$ is set to $(V_1 + V_B)/2$ as in the detection methods of the first and second exemplary modes of embodiment, $V_{W1}$ (the voltage at the point $P_{W1}$) in FIG. 15 will be higher than $V_{th1}$, and thus, when water is in the proximity of the sensor electrode, it will be erroneously determined that a human body is in the proximity of the sensor electrode 11.

Figure 14:
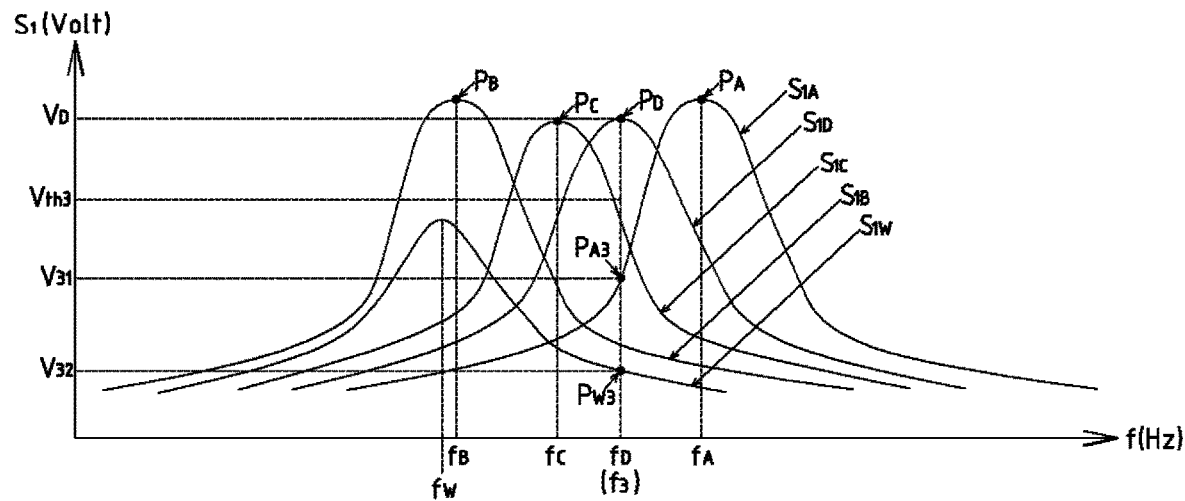
FIG. 14 is a graph serving to describe the determination voltage signal $S_1$ upon having input a high-frequency signal at a third detection frequency $f_3$ to the sensor circuit in the third exemplary mode of embodiment of the present invention.

Here, in the capacitive proximity sensor of the present example, a first detection frequency $f_1$, a second detection frequency $f_2$, and a third detection frequency $f_3$, which satisfy the relationship $f_W \leq f_1 \leq f_B < f_2 < f_3 < f_A$, are set, a first threshold value $V_{th1}$ is set to an intermediate value between $V_{12}$ and $V_{B1}$ (see FIG. 12), a second threshold value $V_{th2}$ is set to an intermediate value between $V_{21}$ and $V_C$ (see FIG. 13), and a third threshold value $V_{th3}$ is set to an intermediate value between $V_{31}$ and $V_D$ (see FIG. 14). Furthermore, if the determination voltage signal $S_1$ has reached or exceeded the first threshold value $V_{th1}$ upon having input the high-frequency signal $S_0$ at the first detection frequency $f_1$ to the sensor circuit 10, or the determination voltage signal $S_1$ has reached or exceeded the second threshold value $V_{th2}$ upon having input the high-frequency signal $S_0$ at the second detection frequency $f_2$ to the sensor circuit 10, or the determination voltage signal $S_1$ has reached or exceeded the third threshold value $V_{th3}$ upon having input the high-frequency signal $S_0$ at the third detection frequency $f_3$ to the sensor circuit 10, it is determined that a human body has touched the door handle (a human body is in the proximity of the sensor electrode 11), and a human detection signal $S_4$ is output. As a result, proximity to the sensor electrode 11 can be detected, not only with the bare hands of a person but also in a thin gloved, or thick gloved state, while preventing erroneous detection due to the proximity of water.

Note that, in the present example as well, the input order of the first detection frequency $f_1$, the second detection frequency $f_2$, and the third detection frequency $f_3$ may be switched.

Furthermore, in the present example, the first detection frequency $f_1$ is set to $f_W$, the second detection frequency $f_2$ is set to $f_C$ and the third detection frequency $f_3$ is set to $f_D$, but so long as the relationship $f_B \leq f_1 < f_2 < f_3 < f_A$ is satisfied, $f_1$, $f_2$ and $f_3$ may be set arbitrarily.

Furthermore, in the present example, $$V_{th1} = (V_{12} + V_{B1})/2$$

$$V_{th2} = (V_{21} + V_C)/2$$

$$V_{th3} = (V_{31} + V_D)/2$$

were set, but so long as approach by the bare hand of a person can be detected using $V_{th1}$, approach in a thin gloved state can be detected using $V_{th2}$, and approach in a thick gloved state can be detected using $V_{th3}$, while preventing erroneous detection due to the proximity of water, $V_{th1}$, $V_{th2}$ and $V_{th3}$ can be arbitrarily set.

Although the exemplary modes of embodiment of the present invention have been described above, the present invention is not limited to these exemplary modes of embodiment and, needless to say, it is possible to appropriately modify or combine the exemplary modes of embodiment described above without departing from the gist of the present invention.

For example, in the first to third exemplary modes of embodiment, the detection frequencies and threshold values were determined based on data concerning the relationship between the frequency f of the high-frequency signal $S_0$ and the determination voltage signal $S_1$ (FIGS. 2, 6, and 11), which had been obtained in advance, and these were stored in the microcomputer 30 in advance, but these can also be determined when the proximity sensor is actually driven.

Specifically, when used as a sensor for unlocking or locking a vehicle door in a keyless entry system, since no object is yet in the proximity of the sensor electrode at the time when the authorized electronic key is authenticated, the data (the resonance frequency $f_A$, the peak voltage $P_A$ and the like) in the graph $S_{1A}$ when no object is in the proximity of the sensor electrode can be acquired by performing a frequency sweep with the high-frequency signal $S_0$ at this point in time.

Then, all of the detection frequencies can be found by way of predetermined calculations based on $f_A$, such as, $$f_1 = f_A - 20 \text{ (kHz)}$$

$$f_2 = f_A - 15 \text{ (kHz)}$$

$$f_3 = f_A - 10 \text{ (kHz)}$$

Furthermore, all of the threshold values can be found by way of predetermined calculations based on $P_A$, such as $$V_{th1}=P_A\times 0.8\ (V)$$

$$V_{th2}=P_A\times 0.6\ (V)$$

$$V_{th2}=P_A\times 0.7\ (V)$$

Note that, these calculations can be arbitrarily determined on the basis of data obtained beforehand, assuming a vehicle door including a door handle and the like, in which the proximity sensor is actually arranged.

Figure 16:
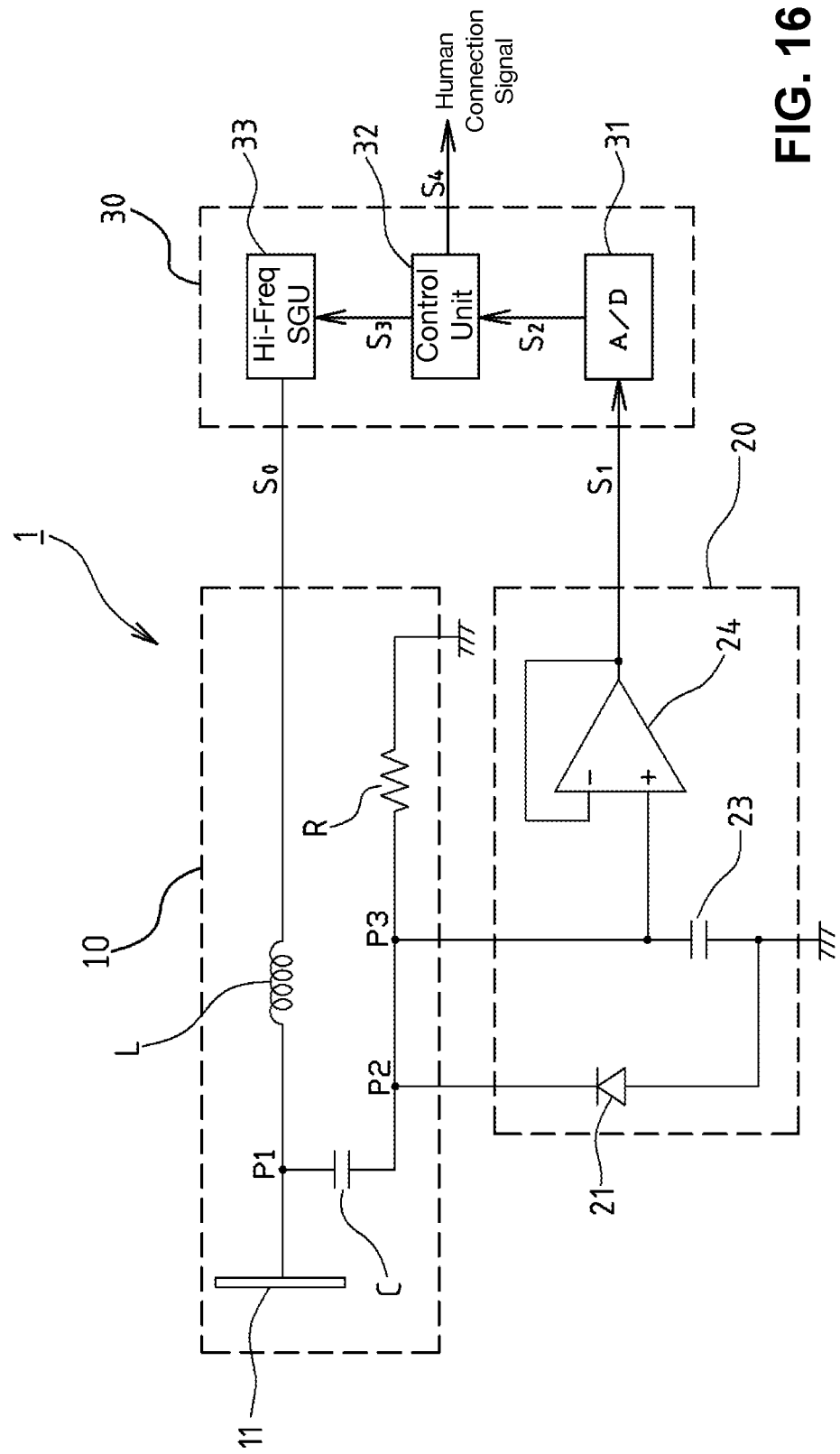
FIG. 16 is a block diagram showing the general configuration of a capacitive proximity sensor according to a variant of the present invention.

Furthermore, there are no particular limitations on the specific configurations of the sensor circuit and the detection circuit, and in addition to that shown in the block diagram in FIG. 1, a circuit configuration such as shown in the block diagram of FIG. 16 may be adopted, for example. In the circuit in FIG. 1, a fixed resistor 22 for a low-pass filter is used, but the circuit shown in FIG. 16 may be used, in which the fixed resistor 22 has been eliminated, by setting the capacitance of the capacitor 23 and the resistance value of the resistor R to appropriate values. In this case, it is preferable to set the resistance value of the resistor R low, so that this is less susceptible to external electromagnetic noise from radio equipment such as mobile phones.

Furthermore, in the first to third exemplary modes of embodiment, a case in which the proximity sensor was mounted in a vehicle door handle was described, but the capacitive proximity sensor of the present invention can also be applied to doors in homes, offices and the like.

Furthermore, in the first to third exemplary modes of embodiment, a case was described in which, when the proximity of an object has been detected, control is performed so as to lock and unlock a door but, for example, various types of interior or exterior illumination and indication lights may be controlled on and off.

What is claimed is:

1. A capacitive proximity sensor, comprising:
   an oscillation means, which outputs a high-frequency signal;
   a sensor circuit to which the high-frequency signal is input, and which includes a sensor electrode;
   a detection circuit, which outputs a determination voltage signal corresponding to the capacitance of the sensor electrode, based on an electrical signal output from the sensor circuit; and
   a control unit,
   wherein the sensor circuit has an LCR series resonance circuit, in which a coil L, a capacitor C, and a resistor R are connected in series in this order;
   the sensor electrode is connected downstream of the coil L and upstream of the capacitor C;
   the detection circuit outputs the determination voltage signal based on the electrical signal at a detection point downstream of the capacitor C and upstream of the resistor R; and
   the control unit detects the proximity of a human body to the sensor electrode, based on the determination voltage signal.

2. The capacitive proximity sensor according to claim 1, having a rectification point between the capacitor C and the detection point.

3. The capacitive proximity sensor according to claim 1, wherein the detection circuit has a low-pass filter and an amplifier.

4. A human body detection method using a capacitive proximity sensor, wherein
   the capacitive proximity sensor comprises:
   an oscillation means, which outputs a high-frequency signal;
   a sensor circuit to which the high-frequency signal is input, and which includes a sensor electrode;
   a detection circuit, which outputs a determination voltage signal corresponding to the capacitance of the sensor electrode, based on an electrical signal output from the sensor circuit; and
   a control unit,
   wherein the sensor circuit has an LCR series resonance circuit, in which a coil L, a capacitor C, and a resistor R are connected in series in this order;
   wherein the sensor electrode is connected downstream of the coil L and upstream of the capacitor C; and
   wherein the detection circuit outputs the determination voltage signal based on the electrical signal at a detection point downstream of the capacitor C and upstream of the resistor R; and
   the method comprising:
   detecting with the control unit detects of the capacitive proximity sensor the proximity of a human body to the sensor electrode, based on the determination voltage signal, wherein
   with $f_A$ being the resonance frequency of the sensor circuit when no object is in the proximity of the sensor electrode, and $f_B$ being the resonance frequency of the sensor circuit when the human body is in the proximity of the sensor electrode, where the relationship is $$f_B < f_A,$$

a first detection frequency $f_1$ and a second detection frequency $f_2$, which satisfy the relationship $$f_B \leq f_1 < f_2 \leq f_A$$

is set;
   with $V_1$ being the determination voltage signal upon having input the high-frequency signal at the first detection frequency $f_1$ to the sensor circuit, when no object is in the proximity of the sensor electrode, a first threshold value $V_{th1}$ which satisfies the relationship $$V_1 < V_{th1}$$

is set;
   with $V_2$ being the determination voltage signal upon having input the high-frequency signal at the second detection frequency $f_2$ to the sensor circuit, when no object is in the proximity of the sensor electrode, a second threshold value $V_{th2}$ which satisfies the relationship $$V_2 < V_{th2}$$

is set; and
   the proximity of the human body to the sensor electrode is detected by detecting that, upon having input the high-frequency signal at the first detection frequency $f_1$ to the sensor circuit, the determination voltage signal has reached or exceeded the first threshold value $V_{th1}$, or that, upon having input the high-frequency signal at the second detection frequency $f_2$ to the sensor circuit, the determination voltage signal has reached or exceeded the second threshold value $V_{th2}$.

5. The human body detection method according to claim 4, wherein the second detection frequency $f_2$ is set to a plurality of mutually differing frequencies.

6. A human body detection method using a capacitive proximity sensor, wherein
   the capacitive proximity sensor comprises:
   an oscillation means, which outputs a high-frequency signal;

a sensor circuit to which the high-frequency signal is input, and which includes a sensor electrode;

a detection circuit, which outputs a determination voltage signal corresponding to the capacitance of the sensor electrode, based on an electrical signal output from the sensor circuit; and a control unit, wherein the sensor circuit has an LCR series resonance circuit, in which a coil L, a capacitor C, and a resistor R are connected in series in this order;

wherein the sensor electrode is connected downstream of the coil L and upstream of the capacitor C; and wherein the detection circuit outputs the determination voltage signal based on the electrical signal at a detection point downstream of the capacitor C and upstream of the resistor R; and the method comprising:

detecting with the control unit of the capacitive proximity sensor the proximity of a human body to the sensor electrode, based on the determination voltage signal, wherein with $f_A$ being the resonance frequency of the sensor circuit when no object is in the proximity of the sensor electrode, $f_B$ being the resonance frequency of the sensor circuit when the human body is in the proximity of the sensor electrode, and $f_W$ being the resonance frequency of the sensor circuit when water is in the proximity of the sensor electrode, where the relationship is $$f_W < f_B < f_A,$$

a first detection frequency $f_1$ and a second detection frequency $f_2$, which satisfy the relationship $$f_W \leq f_1 \leq f_B < f_2 < f_A$$

is set;

with $V_{11}$ being the determination voltage signal upon having input the high-frequency signal at the first detection frequency $f_1$ to the sensor circuit, when no object is in the proximity of the sensor electrode, and $V_{12}$ being the determination voltage signal upon having input the high-frequency signal at the first detection frequency $f_1$ to the sensor circuit, when water is in the proximity of the sensor electrode, a first threshold value $V_{th1}$ which satisfies the relationships $$V_{11} < V_{th1}$$

$$V_{12} < V_{th}1$$

are set;

with $V_{21}$ being the determination voltage signal upon having input the high-frequency signal at the second detection frequency $f_2$ to the sensor circuit, when no object is in the proximity of the sensor electrode, and $V_{22}$ being the determination voltage signal upon having input the high-frequency signal at the second detection frequency $f_2$ to the sensor circuit, when water is in the proximity of the sensor electrode, a second threshold value $V_{th2}$ which satisfies the relationships $$V_{21} < V_{th2}$$

$$V_{22} < V_{th}2$$

are set; and the proximity of the human body to the sensor electrode is detected by detecting that, upon having input the high-frequency signal at the first detection frequency $f_1$ to the sensor circuit, the determination voltage signal has reached or exceeded the first threshold value $V_{th1}$, or that, upon having input the high-frequency signal at the second detection frequency $f_2$ to the sensor circuit, the determination voltage signal has reached or exceeded the second threshold value $V_{th2}$.

7. The human body detection method according to claim 6, wherein the second detection frequency $f_2$ is set to a plurality of mutually differing frequencies.

* * * * *